(12) United States Patent
Yang et al.

(10) Patent No.: US 11,877,075 B2
(45) Date of Patent: *Jan. 16, 2024

(54) ELECTRONIC DEVICE FOR DETECTING IMAGE IN LOW-LIGHT ENVIRONMENT

(71) Applicant: InnoLux Corporation, Miao-Li County (TW)

(72) Inventors: Hui-Ching Yang, Miao-Li County (TW); Tao-Sheng Chang, Miao-Li County (TW); Te-Yu Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/122,704

(22) Filed: Mar. 16, 2023

(65) Prior Publication Data
US 2023/0239588 A1 Jul. 27, 2023

Related U.S. Application Data

(63) Continuation of application No. 17/464,634, filed on Sep. 1, 2021, now Pat. No. 11,632,503, which is a continuation of application No. 16/809,554, filed on Mar. 5, 2020, now Pat. No. 11,134,207.

(30) Foreign Application Priority Data

Mar. 28, 2019 (CN) .......................... 201910245217.1

(51) Int. Cl.
H04N 25/46 (2023.01)
H01L 27/146 (2006.01)
H04N 23/67 (2023.01)
H04N 25/76 (2023.01)
H04N 23/667 (2023.01)

(52) U.S. Cl.
CPC ....... H04N 25/46 (2023.01); H01L 27/14612 (2013.01); H04N 23/667 (2023.01); H04N 23/67 (2023.01); H04N 25/76 (2023.01); H01L 27/14643 (2013.01)

(58) Field of Classification Search
CPC ...... H04N 25/46; H04N 23/667; H04N 23/67; H04N 25/76; H01L 27/14612; H01L 27/14643
See application file for complete search history.

(56) References Cited

U.S. PATENT DOCUMENTS 7,277,129 B1* 10/2007 Lee ....................... H04N 25/616
                                                348/E5.079
2002/0043610 A1* 4/2002 Lee ....................... H04N 25/617
                                                348/E3.018
2009/0201396 A1* 8/2009 Yu ......................... H04N 25/623
                                                348/294

* cited by examiner

Primary Examiner — Ahmed A Berhan
(74) Attorney, Agent, or Firm — Winston Hsu

(57) ABSTRACT

An electronic device includes a first transistor, a second transistor, and a sensing circuit coupled to at least one of the first transistor and the second transistor. The sensing circuit includes a diode, a third transistor, and a fourth transistor. The diode has a first terminal. The third transistor has a first terminal and a second terminal. The first terminal of the third transistor is coupled to the first terminal of the diode. The fourth transistor has a first terminal coupled to the second terminal of the third transistor, and a second terminal coupled to a data driver.

7 Claims, 4 Drawing Sheets

ELECTRONIC DEVICE FOR DETECTING IMAGE IN LOW-LIGHT ENVIRONMENT

CROSS REFERENCE TO RELATED APPLICATIONS

This application is a continuation application of U.S. application Ser. No. 17/464,634, filed on Sep. 1, 2021, which is a continuation application of U.S. application Ser. No. 16/809,554, filed on Mar. 5, 2020. The contents of these applications are incorporated herein by reference.

BACKGROUND OF THE DISCLOSURE

1. Field of the Disclosure

The disclosure relates to an electronic device, in particular, to an electronic device having a photo-sensor capable of detecting an image in a low-light environment.

2. Description of the Prior Art

Active pixel sensors are a type of image sensors having a photodiode and an active amplifier, which have been widely used in the field of image sensing, including digital camera imaging applications, digital scanning applications and fingerprint recognition applications. The active pixel sensor employs a photodiode to detect light intensity and convert the same into a current having a magnitude corresponding to the light intensity. In a low-light environment, the light intensity is extremely low. Therefore, the area of the photodiode is increased to increase the photocurrent of the photodiode in a conventional approach. However, an increase in the photodiode area also results in an increase in the parasitic capacitance of the photodiode, leading to a reduction in a voltage variation generated by the photodiode current, being inefficient in image detection and producing a low image quality in the low light environment.

Therefore, an image sensor capable of detecting an image in the low light environment is in need to enhance the image quality.

SUMMARY OF THE DISCLOSURE

According to an embodiment of the invention, an electronic device includes a first transistor, a second transistor, and a sensing circuit coupled to at least one of the first transistor and the second transistor. The sensing circuit includes a diode, a third transistor, and a fourth transistor. The diode has a first terminal. The third transistor has a first terminal and a second terminal. The first terminal of the third transistor is coupled to the first terminal of the diode. The fourth transistor has a first terminal coupled to the second terminal of the third transistor, and a second terminal coupled to a data driver.

These and other objectives of the present disclosure will no doubt become obvious to those of ordinary skill in the art after reading the following detailed description of the embodiment that is illustrated in the various figures and drawings.

DETAILED DESCRIPTION

Figure 1:
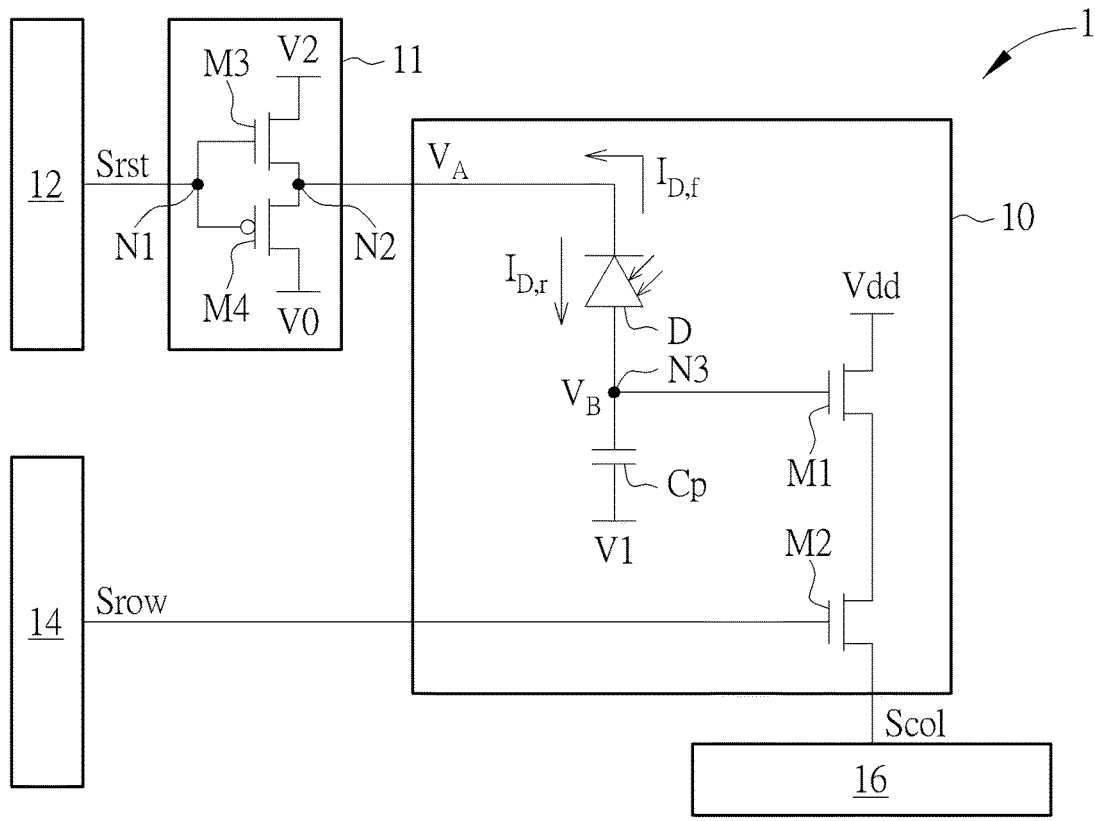
FIG. 1 is a schematic diagram of an electronic device according to an embodiment of the disclosure.

FIG. 1 is a schematic diagram of an electronic device 1 according to an embodiment of the disclosure. The electronic device 1 includes an image sensing circuit 10, a reset circuit 11, a reset driver 12, a scan driver 14 and a data driver 16. The reset driver 12 is coupled to the image sensing circuit 10 via the reset circuit 11. The scan driver 14 and data driver 16 are coupled to the image sensing circuit 10.

The reset circuit 11 includes a third transistor M3 and a fourth transistor M4 connected in cascade, and has a first node N1 and a second node N2. The reset circuit 11 is coupled to the reset driver 12 via the first node N1 to receive a reset signal Srst. The third transistor M3 has a control terminal coupled to the reset driver 12 via the first node N1, a first terminal configured to receive a bias voltage V2 (second voltage), and a second terminal coupled to the second node N2. The fourth transistor M4 has a control terminal coupled to the reset driver 12 via the first node N1, a first terminal coupled to the second node N2, and a second terminal configured to receive a bias voltage V0 (zeroth voltage). The pixel circuit 10 includes a photodiode D, a first transistor M1, a second transistor M2 and a capacitor Cp. The photodiode D has a first terminal coupled to the second node N2, and a second terminal. The first terminal of the photodiode D may be a cathode, and the second terminal of the photodiode D may be an anode. The capacitor Cp has a first terminal coupled to the second terminal of the photodiode D via the third node N3, and a second terminal configured to receive a bias voltage V1 (first voltage). The first transistor M1 has a control terminal coupled to the third node N3, a first terminal configured to receive a bias voltage Vdd, and a second terminal. The second transistor M2 has a control terminal coupled to the scan driver 14 to receive a row selection signal Srow, a first terminal coupled to the second terminal of the first transistor M1, and a second terminal coupled to the data driver 16 to output an output signal Scol. The bias voltage V2 (second voltage) is higher than the bias voltage V1 (first voltage), the bias voltage V1 (first voltage) is higher than the bias voltage V0 (zeroth voltage), and the bias voltage Vdd may be a variable voltage. The first transistor M1, the second transistor M2 and the third transistor M3 may be N-type metal oxide semiconductor (NMOS) transistors, and the fourth transistor M4 may be a P-type metal oxide semiconductor (PMOS) transistor. The second transistor M2 may have a dual gate structure to reduce a leakage current. The first transistor M1 may amplify a reverse bias current $I_{D,r}$ of the photodiode D, the second transistor M2 may select an output signal Scol to be read, the fourth transistor M4 may discharge the capacitor Cp to reset a voltage $V_B$ at the third node N3, and the third transistor M3 may set a voltage $V_A$ at the second node N2 to the bias voltage V2 (second voltage) so that configure the photodiode D in a reverse biased state.

Figure 2:
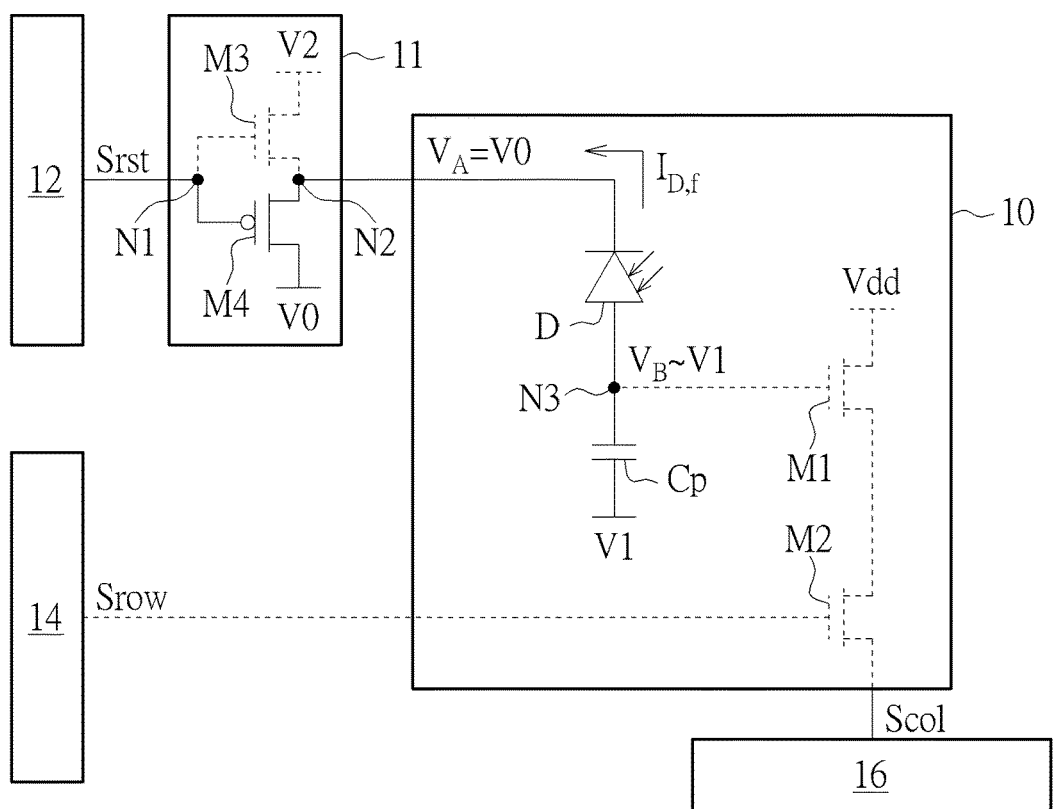
FIG. 2 is a schematic diagram of the electronic device in FIG. 1 operating in a reset mode.
Figure 3:
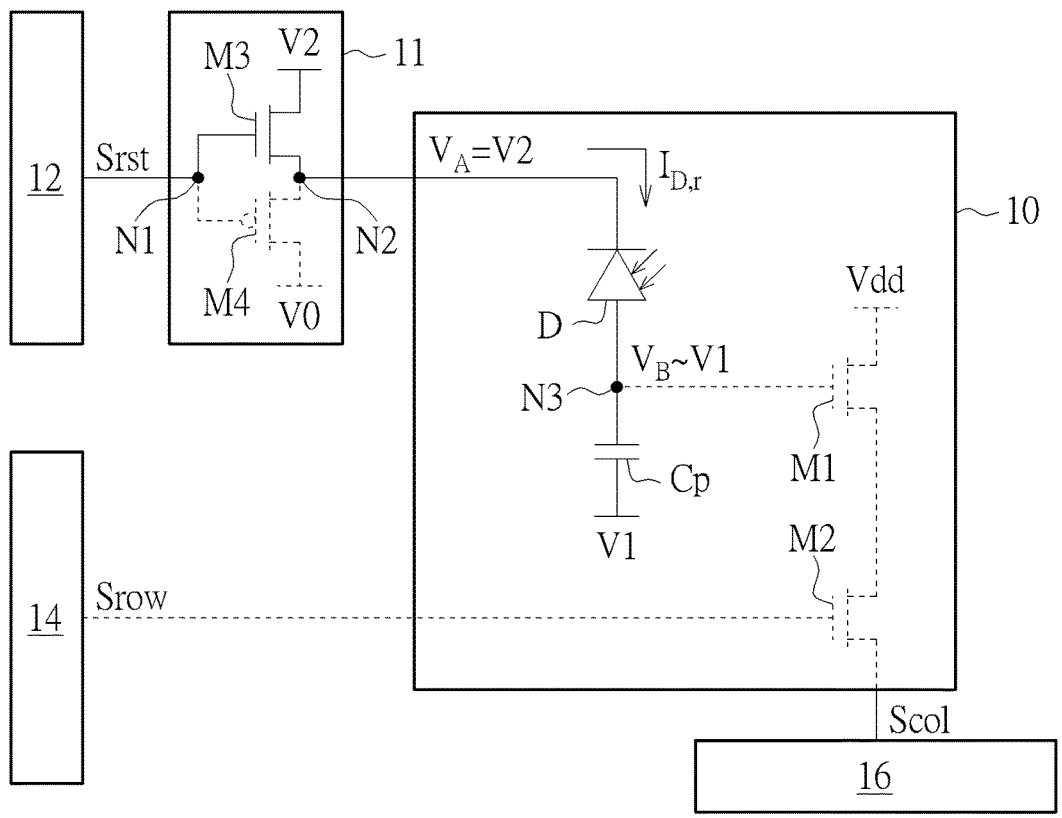
FIG. 3 is a schematic diagram of the electronic device in FIG. 1 operating in a sensing mode.
Figure 4:
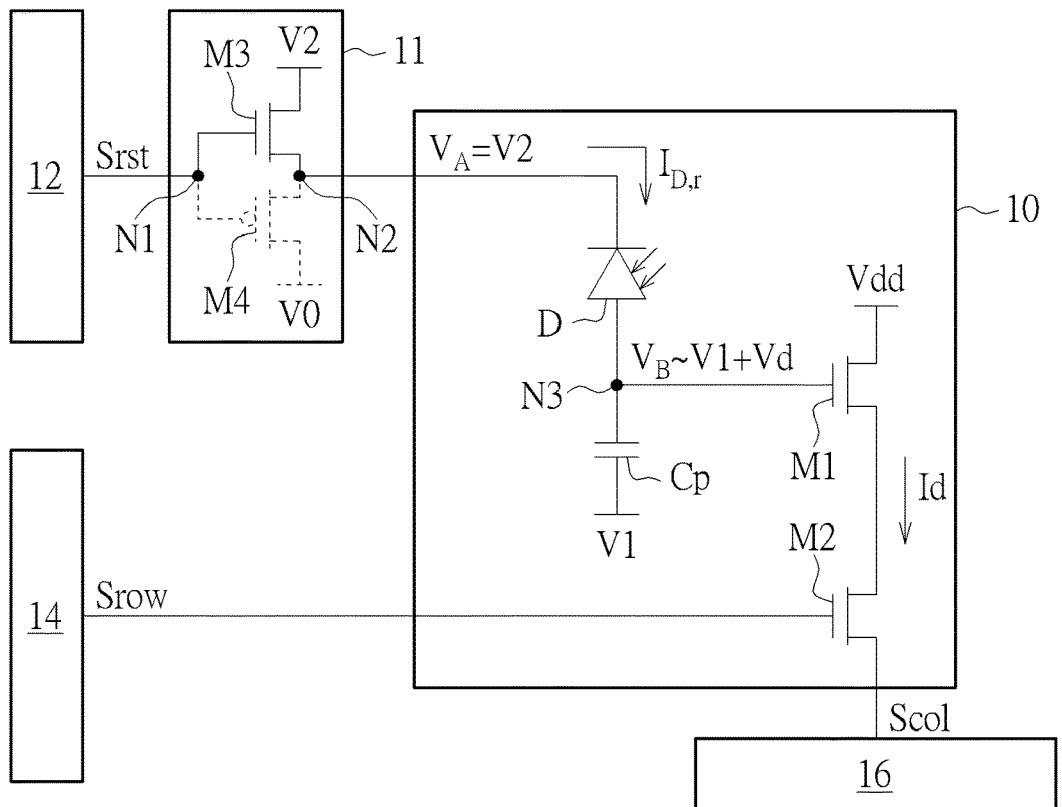
FIG. 4 is a schematic diagram of the electronic device in FIG. 1 operating in a scan mode.

The image sensing circuit 10 may operate in a reset mode, a sensing mode and a scan mode. FIGS. 2, 3, 4 are schematic diagrams of the electronic device 1 operating in the reset mode, the sensing mode and the scan mode. As shown in FIG. 2, in the reset mode, the reset circuit 11 receives the reset signal Srst to turn off the third transistor M3 and turn on the fourth transistor M4, so as to set the voltage $V_A$ at the second node N2 to the bias voltage V0, and set the photodiode D to a forward biased state, and consequently the forward bias current $I_{D,f}$ of the photodiode D will discharge capacitance Cp to reset the voltage $V_B$ at the third node N3 to the bias voltage V1 (first voltage). Since the bias voltage V1 (first voltage) is higher than the bias voltage V0 (zeroth voltage), the voltage at the third node N3 is higher than the voltage $V_A$ at the second node N2 in the reset mode. In the reset mode, the second transistor M2 is turned off by the row selection signal Srow. As shown in FIG. 3, in the sensing mode, the reset signal Srst is applied to the third transistor M3 and the fourth transistor M4 to turn on the third transistor M3 and turn off the fourth transistor M4, setting the bias voltage $V_A$ at the second node N2 to the bias voltage V2 (second voltage), the photodiode D is in the reverse biased state to convert incident light into a reverse bias current $I_{D,r}$. The reverse bias current $I_{D,r}$ continuously charges the capacitor Cp for a period of time to pump the voltage $V_B$ at the third node N3 to (V1+Vd), the voltage Vd being a voltage generated by charging the capacitor Cp using the current $I_{D,r}$. Since the bias voltage V2 (second voltage) is higher than the bias voltage V1 (first voltage), in the sensing mode, the voltage $V_A$ at the second node N2 is higher than the voltage $V_B$ at the third node N3. In the sensing mode, the second transistor M2 is turned off by the row selection signal Srow. As shown in FIG. 4, in the scan mode, the second transistor M2 is turned on by the row selection signal Srow, the voltage $V_B$ at the third node N3 is risen to (V1+Vd) to turn on the first transistor M1, the first transistor M1 is operated in the saturation region to convert the voltage $V_B$ into a current Id, so as to output a voltage Vout to serve as the output signal Scol. Then a processor receives the output signal Scol via the data driver to process and analyze the same to obtain light intensity information. The voltage Vout may be expressed by Equation (1):

$$Vout = V_1 + \frac{I_{D,r} * t}{C} - V_{th} - \sqrt{\frac{2L * Id}{W\mu C_{ox}}} \qquad \text{Equation (1)}$$

wherein:
V1 is the bias voltage;
$I_{D,r}$ is the reverse bias current of the photodiode D;
t is the charging time of charging the capacitor Cp;
C is the capacitance of the capacitor Cp;
$V_{th}$ is the threshold voltage of the first transistor M1;
Id is the drain current of the first transistor M1;
L, W, μ, Cox are the channel length, the channel width, the mobility and the oxide capacitance of the first transistor M1, respectively.

As indicated in Equation (1), the output voltage Vout is positively correlated to the reverse bias current $I_{D,r}$ of the photodiode D and the charging time t of charging the capacitor Cp, and is negatively correlated to the capacitance C of the capacitor Cp. The smaller the capacitance C, the larger the reverse bias current $I_{D,r}$ is, or the longer the charging time t is, the larger the output voltage Vout will be, resulting in easier low-light image recognition from under the screen. In some embodiments, the area of the photodiode D is increased to increase the reverse bias current $I_{D,r}$ and the output voltage Vout, and the capacitor Cp having a fixed capacitance C is connected in series to the photodiode D to limit the equivalent capacitance of the parasitic capacitor of the photodiode D and the capacitor Cp to the capacitance C, thereby eliminating the impact of the increased parasitic capacitor Cd without reducing the output voltage Vout. The capacitor Cp may have fixed capacitance C ranging between 1.2 fF and 10 fF. In some embodiments, The capacitor Cp may have fixed capacitance C ranging between 2% and 20% of the parasitic capacitor Cd.

Figure 7:
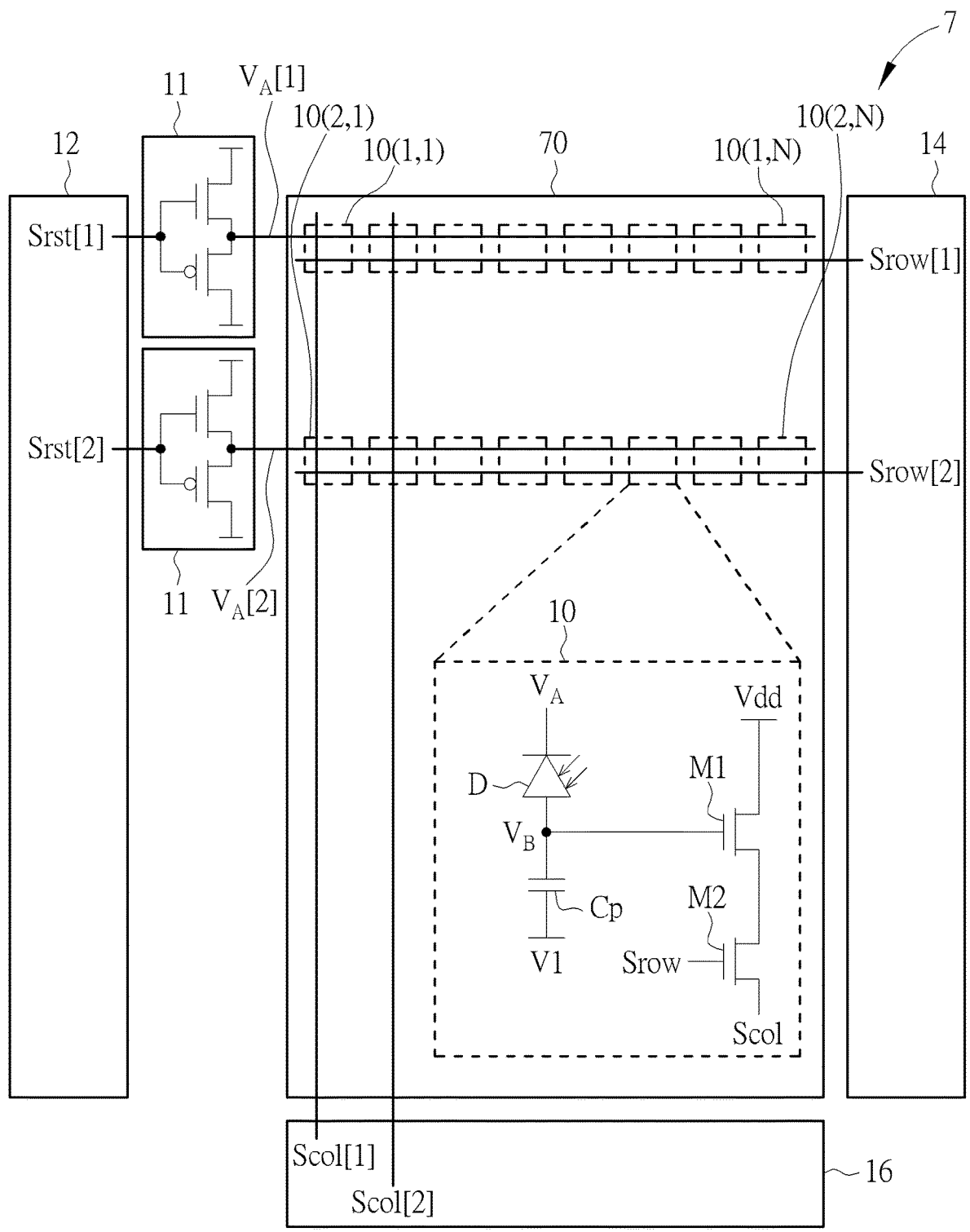
FIG. 7 is a schematic diagram of an electronic device according to another embodiment of the disclosure.

Although only one image sensing circuit 10 is used in FIG. 1, the electronic device 1 may include a plurality of image sensing circuits 10, and may be arranged in an array for sensing light at different positions, as shown in FIG. 7.

Figure 5:
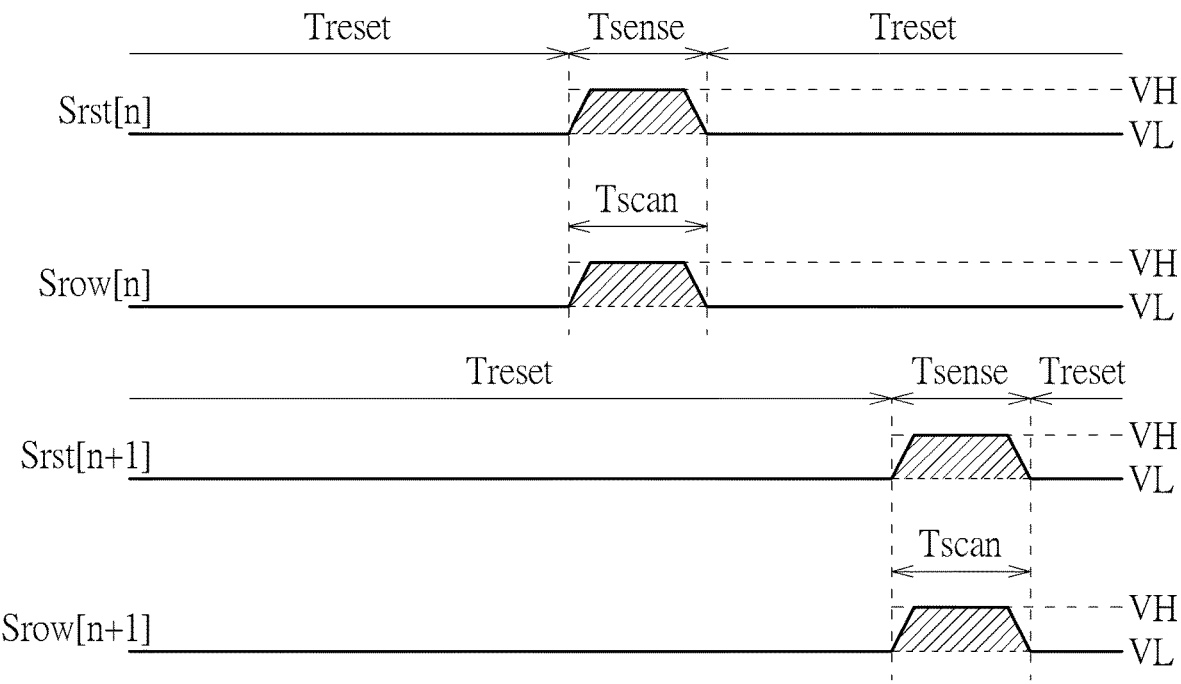
FIG. 5 is a timing diagram of a control method of the electronic device in FIG. 1.
Figure 6:
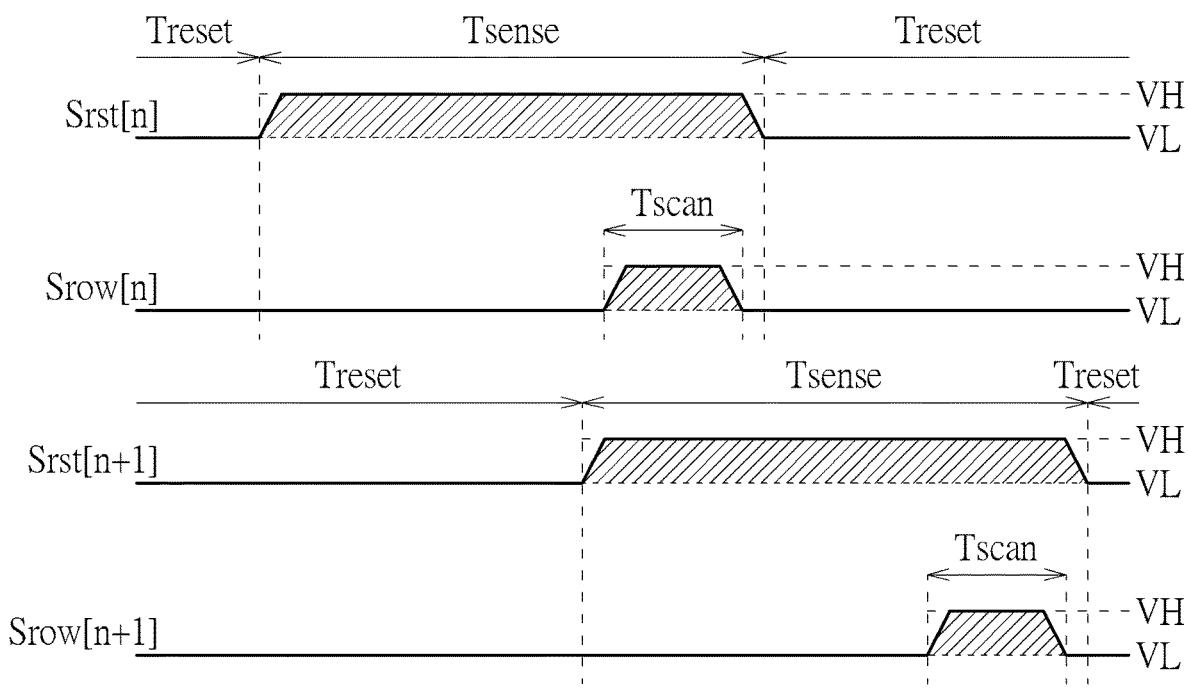
FIG. 6 is a timing diagram of another control method of the electronic device in FIG. 1.

FIGS. 5 and 6 show timing diagrams of selected signals of the electronic device 1 operating by two different control methods. The selected signals include reset signals Srst[n], Srst[n+1] and the row selection signals Srow[n], Srow[n+1], respectively representing the reset signals and the row selection signals transmitted to the image sensing circuits 10 on the nth row and the (n+1)th row. The two control methods in FIGS. 5 and 6 may be employed to detect light by way of sensing and scanning row by row. The reset signals Srst[n], Srst [n+1] may be used to set the image sensing circuits 10 on the nth row and the (n+1)th row to the reset mode during the reset period Treset, and set the image sensing circuits 10 on the nth row and the (n+1)th row to the sensing mode during the sensing period Tsense. The row selection signals Srow[n], Srow[n+1] may be used to set the image sensing circuits 10 on the nth row and the (n+1)th row to the scan mode during the scan period Tscan. FIG. 5 shows a control method employing synchronous reset signals Srst [n], Srst [n+1] and row selection signals Srow[n], Srow[n+1], performing the sensing mode and the scan mode simultaneously, and reducing detection time. FIG. 6 shows a control method employing asynchronous reset signals Srst [n], Srst[n+1] and row selection signals Srow[n], Srow[n+1], performing the sensing mode for a period of time prior to performing the scan mode, and generating clearer signals. The operation methods of the reset mode, sensing mode and the scan mode have been described in FIGS. 2, 3, 4, and will be omitted here for brevity.

In FIG. 5, the reset signal Srst[n] is set to a low potential VL so as to set the voltage $V_A$ to the bias voltage V0 and the reset bias $V_B$ to the bias voltage V1 (first voltage), and then the reset signal Srst[n] and the row selection signal Srow[n] are both set to a high potential VH to sense a change of the voltage $V_B$ and read an output signal Scol[n] on the nth row. During performing the sensing mode and the scan mode on the nth row, the reset signal Srst[n+1] and the row selection signal Srow[n+1] are set to the low potential VL, and after completion of the sensing mode and the scan mode on the nth row, the reset signal Srst[n+1] and the row selection signal Srow[n+1] are simultaneously set to the high potential VH, so as to simultaneously sense the change of the voltage $V_B$ and read the output signal Scol[n+1] on the (n+1) row. By employing the control method in FIG. 5, the electronic device 1 may detect the light intensity and read corresponding output signals Scol[n], Scol[n+1] row by row.

The control method in FIG. 6 is similar to that in FIG. 5, but the sensing period Tsense of the nth row is extended, and the scan period Tscan occurs when the sensing period Tsense of the nth row is almost completed, and the (n+1)th row operates in a similar manner. Compared to FIG. 5, in FIG. 6, the sensing period Tsense is longer, the capacitor Cp has a longer charging time, generating a higher voltage $V_B$, and resulting in a larger output signal Scol correspondingly.

FIG. 7 is a schematic diagram of an electronic device 7 according to another embodiment of the disclosure. The electronic device 7 includes a pixel array 70, the reset circuit 11, the reset driver 12, the scan driver 14 and the data driver 16. The reset driver 12 is coupled to the pixel array 70 via the reset circuit 11, and the scan driver 14 and data driver 16 are coupled to the pixel array 70, so as to control the pixel array 70 to operate in the reset mode, the sensing mode or the scan mode. The pixel array 70 includes a plurality of image sensing circuits 10(1,1) to 10(M,N) arranged in an array. The reset driver 12 and the scan driver 14 may be respectively disposed on both sides of the pixel array 70, and the data driver 16 may be disposed on the bottom of the electronic device 7. The reset signal Srst[1] is used to reset the first image sensing circuits 10 on the first row, and the reset signal Srst[2] is used to resets the image sensing circuits 10 on the second row. The row selection signal Srow[1] is used to select the first image sensing circuits 10 on the first row, and the row selection signal Srow[2] is used to select the image sensing circuits 10 on the second row to read the sensed light intensity.

The image sensing circuit 10 in FIG. 1 and the pixel array 70 in FIG. 7 may increase reverse bias current $I_{D,r}$ by increasing area of the photodiode D, while coupling the capacitor Cp in series to the photodiode D to limit the equivalent capacitance of the photodiode D and the capacitor Cp to the capacitance C, thereby increasing the output voltage Vout, resulting in easier image detection in a low-light environment when used in a fingerprint scanner.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device comprising:
   a first transistor having a control terminal;
   a second transistor having a control terminal coupled to the control terminal of the first transistor; and
   a sensing circuit coupled to at least one of the first transistor and the second transistor and comprising:
      a diode having a first terminal;
      a third transistor having a first terminal and a second terminal, the first terminal of the third transistor being coupled to the first terminal of the diode; and
      a fourth transistor having a first terminal coupled to the second terminal of the third transistor, and a second terminal coupled to a data driver.

2. The electronic device of claim 1, wherein the diode is coupled to the at least one of the first transistor and the second transistor.

3. The electronic device of claim 1, wherein:
   the third transistor further has a third terminal;
   the first transistor further has a first terminal; and
   the third terminal of the third transistor and the first terminal of the first transistor are configured to receive different voltages.

4. The electronic device of claim 3, wherein:
   the first transistor further has a second terminal; and
   the second transistor further has a first terminal coupled to the second terminal of the first transistor.

5. The electronic device of claim 4, wherein:
   the second transistor further has a second terminal configured to receive a first voltage less than a second voltage received at the first terminal of the first transistor.

6. The electronic device of claim 1, wherein the fourth transistor further has a third terminal coupled to a scan driver.

7. An electronic device comprising:
   a first transistor and a second transistor, wherein the first transistor and the second transistor are coupled to a reset driver; and
   a sensing circuit coupled to at least one of the first transistor and the second transistor and comprising:
      a diode having a first terminal;
      a third transistor having a first terminal and a second terminal, the first terminal of the third transistor being coupled to the first terminal of the diode; and
      a fourth transistor having a first terminal coupled to the second terminal of the third transistor, and a second terminal coupled to a data driver.

* * * * *